(12) United States Patent
Tajiri et al.

(10) Patent No.: US 12,040,590 B2
(45) Date of Patent: Jul. 16, 2024

(54) SEMICONDUCTOR LASER DEVICE

(71) Applicant: ROHM CO., LTD., Kyoto (JP)

(72) Inventors: Hiroyuki Tajiri, Kyoto (JP); Kenji Sakai, Kyoto (JP); Kazuyoshi Izumi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 682 days.

(21) Appl. No.: 17/273,962

(22) PCT Filed: Sep. 24, 2019

(86) PCT No.: PCT/JP2019/037231
§ 371 (c)(1),
(2) Date: Mar. 5, 2021

(87) PCT Pub. No.: WO2020/071168
PCT Pub. Date: Apr. 9, 2020

(65) Prior Publication Data
US 2021/0336410 A1 Oct. 28, 2021

(30) Foreign Application Priority Data
Oct. 1, 2018 (JP) .................................. 2018-186456

(51) Int. Cl.
*H01S 5/022* (2021.01)
*H01S 5/02212* (2021.01)
*H01S 5/0231* (2021.01)

(52) U.S. Cl.
CPC ............ *H01S 5/0231* (2021.01); *H01S 5/022* (2013.01); *H01S 5/02212* (2013.01)

(58) Field of Classification Search
CPC ...................................................... H01S 5/0231
See application file for complete search history.

(56) References Cited

U.S. PATENT DOCUMENTS

| | | | |
|---|---|---|---|
| 2005/0072985 A1* | 4/2005 | Yamamoto | H01S 5/0231 257/98 |
| 2008/0137700 A1* | 6/2008 | Yamamoto | H01S 5/02212 438/26 |
| 2018/0145478 A1* | 5/2018 | Sakai | H01S 5/02469 |

FOREIGN PATENT DOCUMENTS

| | | |
|---|---|---|
| CN | 1619901 | 5/2005 |
| CN | 105312851 A * | 2/2016 |

(Continued)

OTHER PUBLICATIONS

Machine Translation of CN 105312851 (Year: 2016).*

(Continued)

*Primary Examiner* — Minsun O Harvey
*Assistant Examiner* — Stephen Sutton Kotter
(74) *Attorney, Agent, or Firm* — HSML P.C.

(57) ABSTRACT

A semiconductor laser device A1 comprises a semiconductor laser chip 2 and a stem 1. The stem 1 includes a base 11 and leads 3A, 3B, and 3C fixed to the base, and supports the semiconductor laser chip 2. The semiconductor laser device A1 further comprises a first metal layer 15 including a first layer 151 covering the base 11 and the leads 3A, 3B, and 3C, a second layer 152 interposed between the first layer 151 and each of the base 11 and the leads 3A, 3B, and 3C, and a third layer 153 interposed between the second layer 152 and each of the base 11 and the leads 3A, 3B, and 3C. Crystal grains in the second layer 152 are smaller than crystal grains in the third layer 153. Such a configuration can suppress corrosion.

18 Claims, 18 Drawing Sheets

(56) References Cited

FOREIGN PATENT DOCUMENTS

| | | |
|---|---|---|
| CN | 107534268 | 1/2018 |
| JP | 2004-31900 A | 1/2004 |
| JP | 2005-217093 A | 8/2005 |
| JP | 2006-196506 A | 7/2006 |
| JP | 2007-48937 A | 2/2007 |
| JP | 2007-53252 A | 3/2007 |

OTHER PUBLICATIONS

International Search Report issued in PCT/JP2019/037231, Nov. 19, 2019 (2 pages).
Office Action received in the corresponding Chinese Patent application, Dec. 4, 2023, and machine translation.

* cited by examiner

SEMICONDUCTOR LASER DEVICE

TECHNICAL FIELD

The present disclosure relates to a semiconductor laser device.

BACKGROUND ART

A semiconductor laser device is widely employed as a light source device provided for various electronic devices. Patent Document 1 discloses an example of a conventional semiconductor laser device. The semiconductor laser device disclosed in Patent Document 1 includes a stem, a semiconductor laser chip, and a cap. The stem is made of metal, and has a plurality of leads. Each of the leads is fixed to a plate-like base, a block projecting forward in an emission direction from the base, and the stem. The plurality of leads extend backward in the emission direction. The semiconductor laser chip is mounted on the block. The cap covers the block and the semiconductor laser chip, and has an opening that allows light from the semiconductor laser chip to pass through. According to such a configuration, when power is applied via the plurality of leads, light from the semiconductor laser chip is emitted forward in the emission direction.

PRIOR ART DOCUMENT

Patent Document
Patent Document 1: JP-A-2004-31900

SUMMARY OF THE INVENTION

Technical Problem

However, the stem made of metal may corrode during the use of the semiconductor laser device.

The present disclosure has been conceived under the foregoing circumstances and aims to provide a semiconductor laser device capable of suppressing corrosion.

Solution to Problem

A semiconductor laser device provided by the present disclosure comprises: a semiconductor laser chip; a stem including a base and a lead fixed to the base, the stem supporting the semiconductor laser chip; and a first metal layer including a first layer covering the base and the lead, a second layer interposed between the first layer and each of the base and the lead, and a third layer interposed between the second layer and each of the base and the lead, where crystal grains in the second layer are smaller than crystal grains in the third layer.

Advantages of Invention

The semiconductor laser device disclosed herein can suppress corrosion.

Other features and advantages of the present disclosure will become apparent from the following detailed description with reference to the accompanying drawings.

MODE FOR CARRYING OUT THE INVENTION

Figure 1:
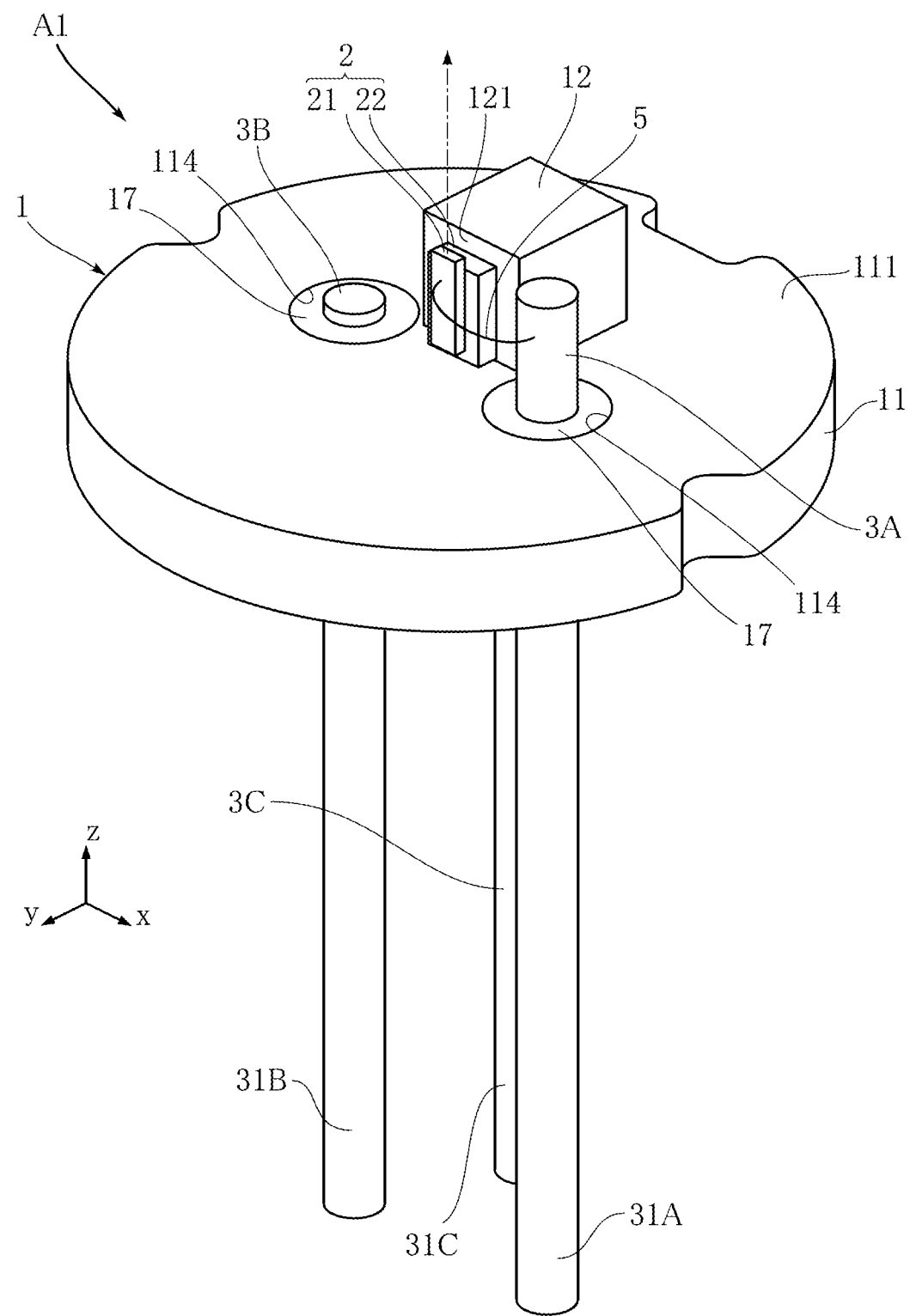
FIG. 1 is a perspective view showing a semiconductor laser device according to a first embodiment of the present disclosure.

Hereinafter, preferred embodiments of the present disclosure will be described in detail with reference to the drawings.

The terms such as "first", "second" and "third" in the present disclosure are used merely as labels and not intended to impose orders on the elements accompanied with these terms.

First Embodiment

FIGS. 1 to 7 show a semiconductor laser device according to a first embodiment of the present disclosure. A semiconductor laser device A1 of the present embodiment includes a stem 1, a semiconductor laser chip 2, a wire 5, and a first metal layer 15. The semiconductor laser device A1 may be used as, but not limited to, a light source for reading and writing in a CD player or a DVD recorder, or as a light source of a laser printer.

The z direction in FIGS. 1 to 7 corresponds to an emission direction of the semiconductor laser chip 2. The x direction and the y direction are perpendicular to the z direction.

The stem 1 serves as the base of the semiconductor laser device A1, and has a base 11, a block 12, and a plurality of leads 3A, 3B, and 3C. The base 11 and the block 12 in the stem 1 of the present embodiment are integrally formed. The stem 1 may be made of, but not limited to, Fe or an Fe alloy. The number of leads in the stem 1 is not particularly limited. The following description gives an example of having three leads, i.e., leads 3A, 3B, and 3C.

The base 11 is a plate-like portion whose thickness direction is in the z direction. In the present embodiment, the base 11 has a substantially circular shape as viewed in the z direction. The base 11 has an obverse surface 111 that faces forward in the z direction. For example, the base 11 has dimensions such as a diameter of approximately 5.6 mm and a thickness of approximately 1.2 mm.

The base 11 is formed with two lead through-holes 114. The shape and size of each lead through-hole 114 are not particularly limited. In the present embodiment, the lead through-holes 114 are circular with a diameter of approximately 1.0 mm. The diameter of each lead through-hole 114 is appropriately selected according to the sizes of the base 11 and the leads 3A and 3B, the distance between the lead 3A and the lead 3B, etc.

Figure 2:
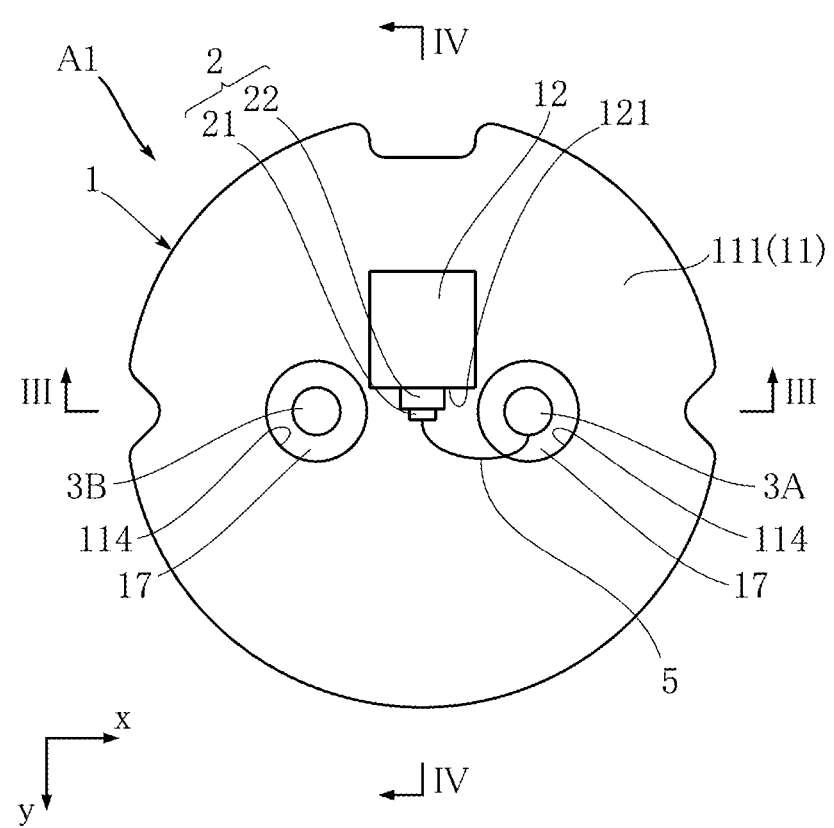
FIG. 2 is a plan view showing the semiconductor laser device according to the first embodiment of the present disclosure.

Two lead through-holes 114 are formed to fix the leads 3A and 3B to the base 11. As shown in FIG. 2, the two lead through-holes 114 are formed on both sides of the block 12 in the x direction. The lead through-holes 114 pass through the base 11 in the z direction. The shape of each lead through-hole 114 is not particularly limited. In the present embodiment, the lead through-holes 114 each have a circular shape as viewed in the z direction.

The block 12 projects forward in the z direction (upward in the figures) from the obverse surface 111 of the base 11. The shape of the block 12 is not particularly limited. In the present embodiment, the block 12 has a rectangular parallelepiped shape. The block 12 has a supporting surface 121. The supporting surface 121 is a surface on which the semiconductor laser chip 2 is mounted. In the present embodiment, the supporting surface 121 is parallel to the z direction. For example, the block 12 has dimensions of approximately 1.0 mm in the x direction, approximately 1.2 mm in the y direction, and approximately 1.5 m in the z direction.

The plurality of leads 3A, 3B, and 3C are used to fix the semiconductor laser device A1 to an electronic device or the like, and form power supply paths to the semiconductor laser chip 2. The plurality of leads 3A, 3B, and 3C are rod-like members made of an Fe—Ni alloy and having a diameter of approximately 0.45 mm, for example. The size and the shape of the plurality of leads 3A, 3B, and 3C are not particularly limited.

Figure 3:
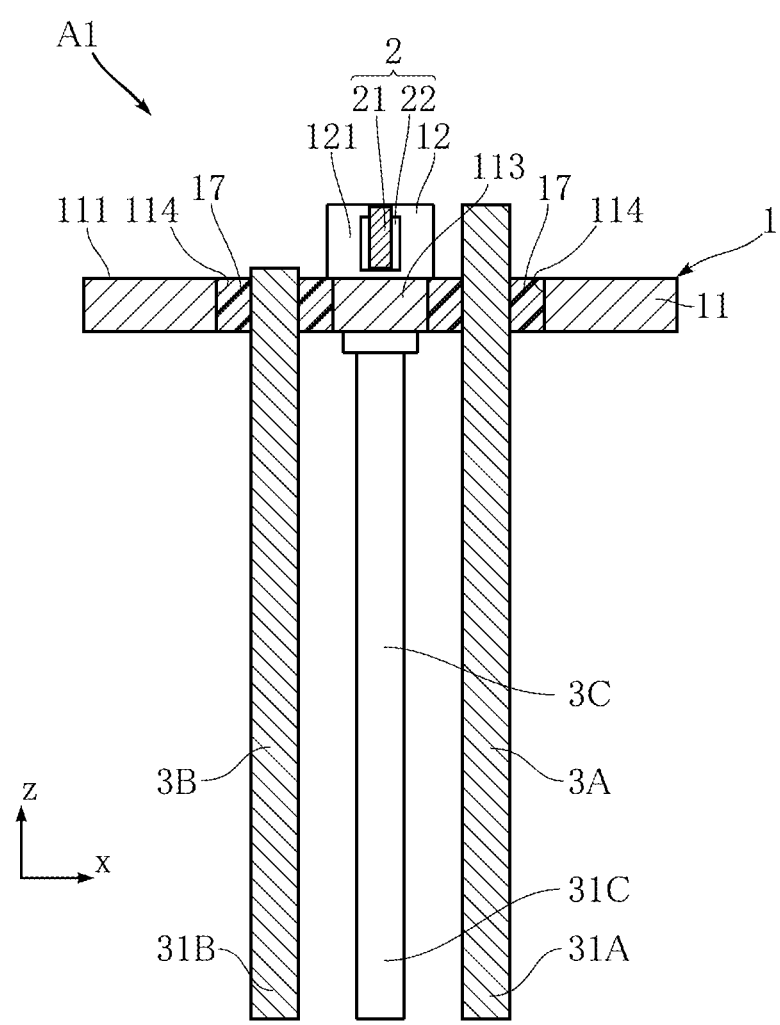
FIG. 3 is a cross-sectional view along line III-III in FIG. 2.

The lead 3A and the lead 3B are inserted in the two lead through-holes 114, respectively. As shown in FIG. 3, a portion of the lead 3A on the forward side in the z direction projects forward from the lead through-hole 114 in the z direction. Also, a large portion of the lead 3A on the backward side in the z direction projects backward from the base 11 in the z direction. A portion of the lead 3B on the forward side in the z direction projects slightly forward from the lead through-hole 114 in the z direction but by less than the projection length of the lead 3A. Also, a large portion of the lead 3B on the backward side in the z direction projects backward from the base 11 in the z direction. A portion of the lead 3A near the backward end thereof in the z direction serves as a terminal portion 31A used when the semiconductor laser device A1 is mounted on an electronic device or the like. Similarly, a portion of the lead 3B near the backward end thereof in the z direction serves as a terminal portion 31B used when the semiconductor laser device A1 is mounted on an electronic device or the like.

The length of the lead 3A is approximately 9.2 mm, for example. The portion of the lead 3A accommodated in the lead through-hole 114 has a length of approximately 1.2 mm, the portion projecting forward in the z direction has a length of approximately 1.5 mm, and the portion projecting backward in the z direction has a length of approximately 6.5 mm.

The length of the lead 3B is approximately 7.7 to 7.9 mm, for example. The portion of the lead 3B accommodated in the lead through-hole 114 has a length of approximately 1.2 mm, the portion projecting forward in the z direction has a length of approximately 0 to 0.2 m, and the portion projecting backward in the z direction has a length of approximately 6.5 m.

Figure 4:
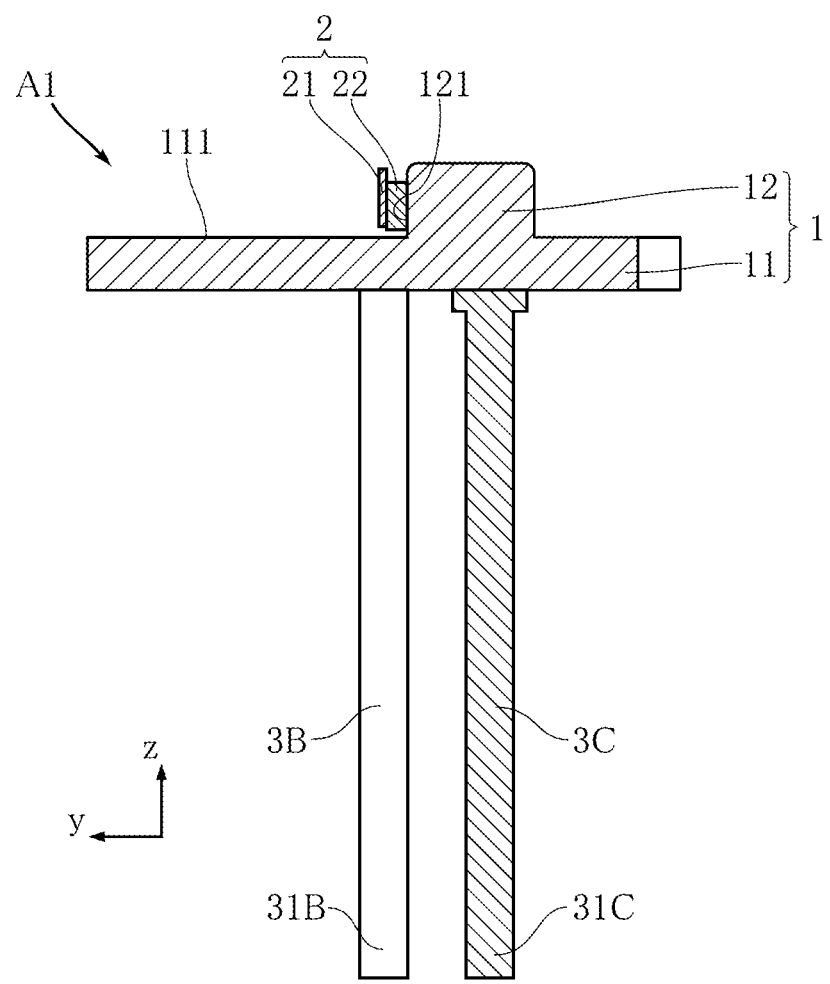
FIG. 4 is a cross-sectional view along line IV-IV in FIG. 2.

As shown in FIG. 4, the lead 3C is joined to the surface of the base 11 that faces backward in the z direction, and is electrically connected to the base 11. As can be understood from FIGS. 3 and 4, in the present embodiment, the lead 3C overlaps with the block 12 as viewed in the z direction. The length of the lead 3C is approximately 6.5 nm, for example. A portion of the lead 3C near the backward end thereof in the z direction serves as a terminal portion 31C used when the semiconductor laser device A1 is mounted on an electronic device or the like. The method of joining the lead 3C and the base 11 is not particularly limited. For example, the joining can be achieved by welding or a conductive joining material as appropriate.

Figure 5:
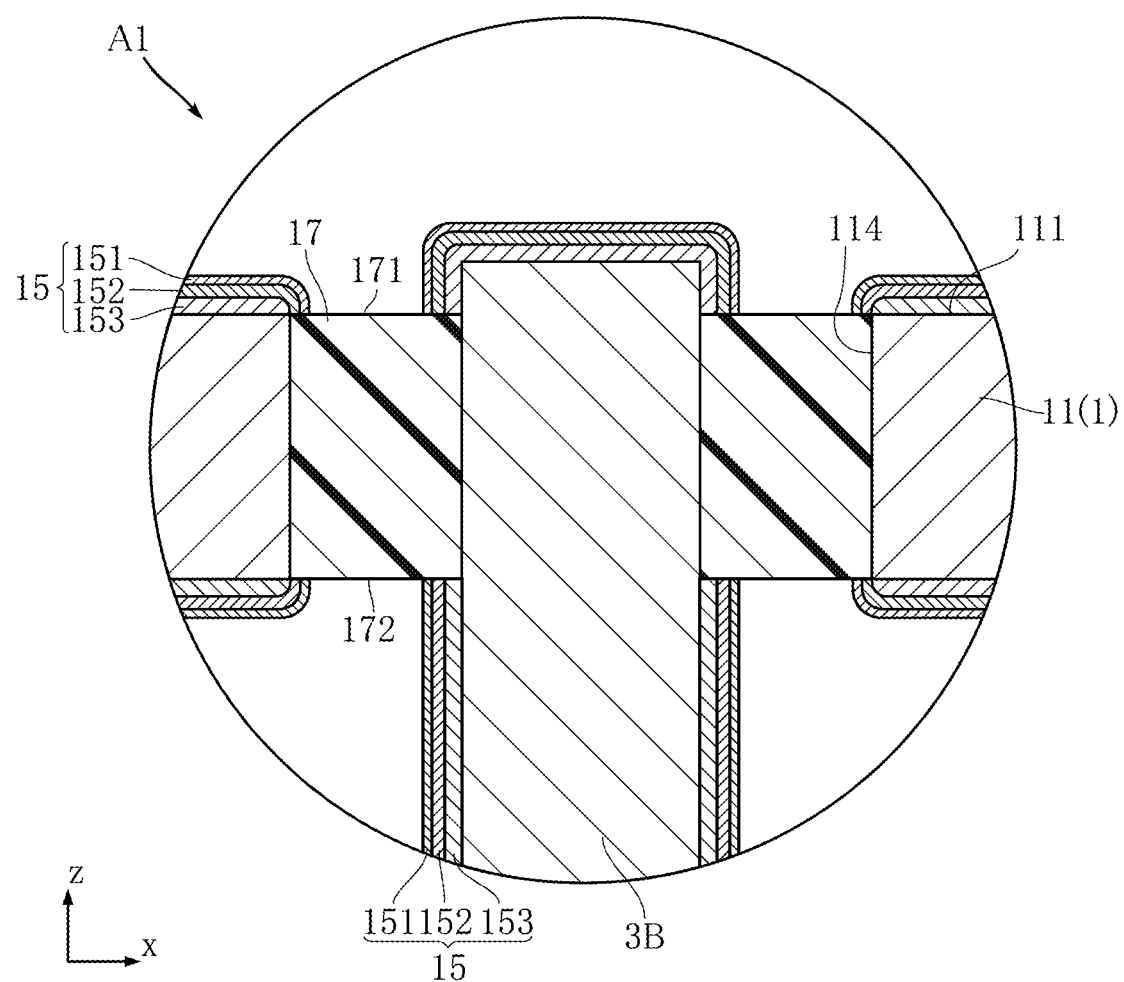
FIG. 5 is an enlarged cross-sectional view showing a main section of the semiconductor laser device according to the first embodiment of the present disclosure.
Figure 6:
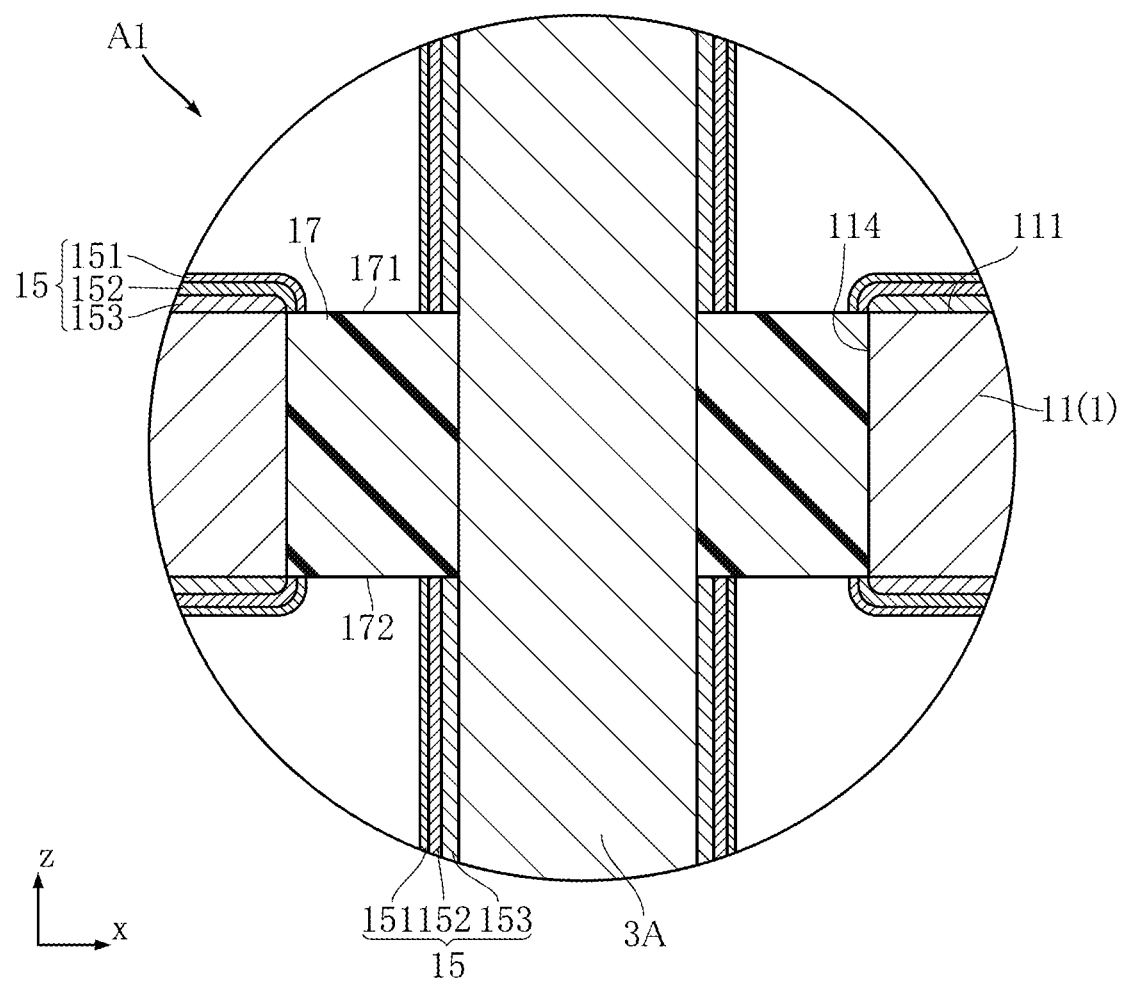
FIG. 6 is an enlarged cross-sectional view showing a main section of the semiconductor laser device according to the first embodiment of the present disclosure.

In the present embodiment, as shown in FIGS. 2 and 3, spaces between the leads 3A, 3B and the two lead through-holes 114 are filled with an insulating filler 17. The insulating filler 17 has a function of fixing the leads 3A and 3B to the base 11, and insulating the leads 3A and 3B from the base 11. The material of the insulating filler 17 is not particularly limited, but in the present embodiment, the insulating filler 17 is made of glass. As shown in FIGS. 5 and 6, the insulating filler 17 has an obverse surface 171 and a reverse surface 172. The obverse surface 171 faces the same side as the obverse surface 111 faces in the z direction. The reverse surface 172 faces away from the obverse surface 171 in the z direction. The shapes of the obverse surface 171 and the reverse surface 172 are not limited. In the illustrated example, the obverse surface 171 and the reverse surface 172 are flat surfaces.

As shown in FIGS. 1 and 2, the lead 3A is connected to the semiconductor laser chip 2 by the wire 5. More specifically, the lead 3A is connected by the wire 5 to a pad electrode (not shown) formed on a semiconductor element 21 of the semiconductor laser chip 2. The wire 5 is made of Au, for example. In the semiconductor laser chip 2, the wire 5 may be bonded to the pad electrode formed on the semiconductor element 21. Alternatively, the wire 5 may be bonded to a pad formed on a sub-mound 22. The lead 3C is electrically connected to the back electrode of the sub-mound 22 of the semiconductor laser chip 2 via the base 11 and a joining material. According to such a configuration, in the semiconductor laser device A1, power supply paths to the semiconductor laser chip 2 are formed by the lead 3A and the lead 3C.

When power is supplied to the semiconductor laser device A1 only to cause the semiconductor laser chip 2 to emit light, the lead 3B may not be used as a power path. The lead 3B may be used to simply mechanically fix the semiconductor laser device A1 to an electronic device. Alternatively, the lead 3B may be used as a power supply path to the semiconductor laser chip 2. If the semiconductor laser device A1 includes a light receiving element (not shown), the light receiving element may be electrically connected to the lead 3B.

The semiconductor laser chip 2 is a light-emitting element of the semiconductor laser device A1. In the present embodiment, the semiconductor laser chip 2 is made up of the semiconductor element 21 and the sub-mound 22. Note that the semiconductor laser chip 2 is not limited to this configuration, and may include only the semiconductor element 21 and not the sub-mound 22. In the present disclosure, the semiconductor laser chip 2 refers to an element that is mounted on, for example, the supporting surface 121 of the block 12 of the stem 1. In the case of employing the sub-mound 22, the semiconductor laser chip 2 is defined as an element including the sub-mound 22. In the illustrated example, the forward end of the semiconductor element 21 in the z direction projects more forward in the z direction than the forward end of the sub-mound 22 in the z direction. However, it is not limited to such a configuration, and the forward end of the semiconductor element 21 in the z direction may not project more forward than the forward end of the sub-mound 22 in the z direction.

The semiconductor element 21 has a configuration in which a plurality of semiconductor layers are stacked on each other. The semiconductor element 21 has an elongated shape in the z direction. The semiconductor element 21 emits light forward in the z direction. The sub-mound 22 supports the semiconductor element 21, and is joined to the supporting surface 121 of the block 12 of the stem 1. The sub-mound 22 may be made of Si or AlN. In the present embodiment, the sub-mound 22 is formed with a conduction path (not shown) such as a wiring pattern or a through-hole electrode for electrically connecting the semiconductor element 21 to the block 12.

The sub-mound 22 of the semiconductor laser chip 2 is joined to the supporting surface 121 of the block 12 of the stem 1 with, for example, a joining material (not shown). The joining material is not particularly limited as long as it can join the semiconductor laser chip 2 appropriately, and may be a metal paste or solder containing Ag, In, Au, or Sn, for example. Note that the present embodiment employs a joining material having electrical conductivity. This allows a back electrode (not shown), for example, formed on the semiconductor element 21 to be electrically connected to the block 12 via the joining material (not shown).

Figure 7:
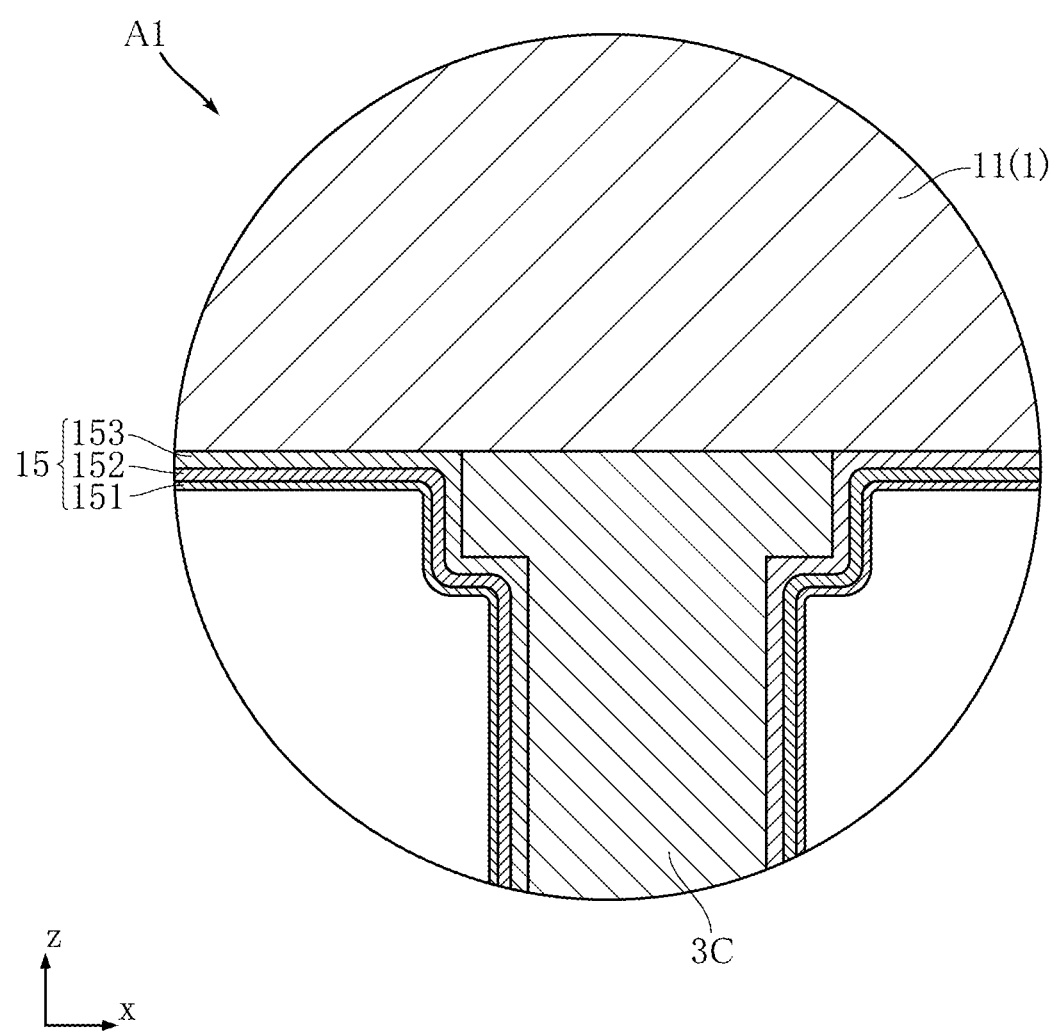
FIG. 7 is an enlarged cross-sectional view showing a main section of the semiconductor laser device according to the first embodiment of the present disclosure.

As shown in FIGS. 5, 6, and 7, the first metal layer 15 covers the base 11 and the plurality of leads 3A, 3B, and 3C. In the present embodiment, the first metal layer 15 includes a first layer 151, a second layer 152, and a third layer 153. The first layer 151 covers the base 11 and the plurality of leads 3A, 3B, and 3C. The second layer 152 is provided between the base 11 and the first layer 151, and between the plurality of leads 3A, 3B, and 3C and the first layer 151. The third layer 153 is provided between the stem 1 and the second layer 152, and between the plurality of leads 3A, 3B, and 3C and the second layer 152. In the illustrated example, the third layer 153 is in contact with the base 11 and the plurality of leads 3A, 3B, and 3C. The second layer 152 is in contact with the third layer 153. The first layer 151 is in contact with the second layer 152.

The crystal grains in the second layer 152 are smaller than those in the third layer 153. For example, the first layer 151 may be a Au plating layer. For example, the second layer 152 may be a Pd plating layer. For example, the third layer 153 may be a Ni plating layer.

The absolute thickness of the first layer 151 and the second layer 152 and the relative relationship therebetween are not limited. In the present embodiment, the second layer 152 is thicker than the first layer 151. The second layer 152 is thinner than the third layer 153. The first layer 151 has a thickness of approximately 0.01 μm to 0.1 μm, for example. The second layer 152 has a thickness of approximately 0.05 μm to 1.0 μm, for example. The third layer 153 has a thickness of approximately 2.0 μm to 5.0 μm, for example.

The method for forming the first layer 151, the second layer 152, and the third layer 153 is not particularly limited. For example, it is possible to use barrel plating.

As shown in FIGS. 5 and 6, in the illustrated example, the first metal layer 15 is formed in areas excluding the boundary between the base 11 of the stem 1 and the insulating filler 17. That is, the first metal layer 15 is formed on the obverse surface 111 of the base 11, the surface opposite to the obverse surface 111, and the peripheral end surface, but is not formed in the lead through-holes 114. The first metal layer 15 is also formed in areas excluding the boundary between the leads 3A, 3B and the insulating filler 17. That is, the first metal layer 15 is formed on the portions of the leads 3A and 3B that are exposed from the insulating filler 17.

As shown in FIG. 7, in the illustrated example, the first metal layer 15 is formed in areas excluding the boundary between the lead 3C and the base 11. That is, the first metal layer 15 is formed on the lead 3C except for the portion that is joined to the base 11.

In one example of the manufacturing of the semiconductor laser device A1 according to the present embodiment, the leads 3A, 3B, and 3C are attached to the base 11, and then the third layer 153, the second layer 152, and the first layer 151 are formed in this order by barrel plating.

Next, advantages of the semiconductor laser device A1 will be described.

According to the present embodiment, the second layer 152 is provided between the first layer 151 and the third layer 153. The second layer 152 contains smaller crystal grains than the third layer 153. In this way, during the use of the semiconductor laser device A1, the third layer 153 is prevented from spreading into the first layer 151 and leaking to the surface of the first metal layer 15. Preventing the spread and leak of the third layer 153 allows the third layer 153 to cover the base 11 and the leads 3A, 3B, and 3C more reliably for a longer period of time. This makes it possible to suppress corrosion of the base 11 and the leads 3A, 3B, and 3C.

The third layer 153 is made of Ni, and therefore is suitable for suppressing corrosion of the base 11 and the leads 3A, 3B, and 3C. The second layer 152 is made of Pd, so that the crystal grains of the second layer 152 are definitely smaller than those of the third layer 153. Since the first layer 151 is made of Au, there are advantages such as ease of joining the wire 5 and ease of soldering when mounting the semiconductor laser device A1 on a circuit board.

Although the absolute thickness of the first layer 151 and the second layer 152 and the relative relationship therebetween are not limited, forming the second layer 152 to be thicker than the first layer 151 can more reliably prevent, for example, spreading of the third layer 153. Since the second layer 152 is thinner than the third layer 153, it is possible to prevent the entire thickness of the first metal layer 15 from becoming unreasonably large. The configuration in which the third layer 153 is relatively thick is suitable for suppressing corrosion of the base 11 and the leads 3A, 3B, and 3C.

FIGS. 8 to 18 show variations and other embodiments of the present disclosure. Note that in these figures, the same reference signs as the above embodiment are given to elements that are the same as or similar to the above embodiment.

First Variation of First Embodiment

Figure 8:
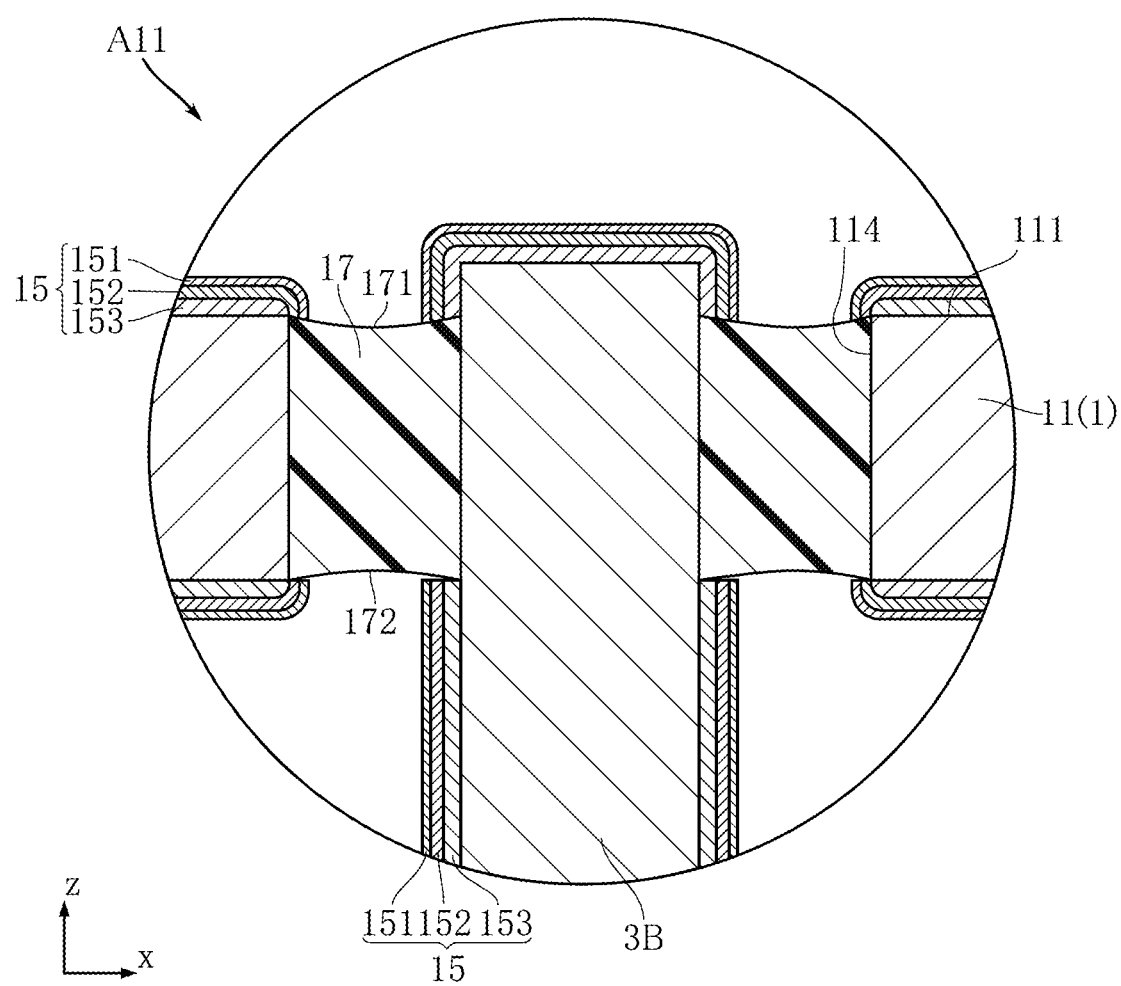
FIG. 8 is an enlarged cross-sectional view showing a main section of a first variation of the semiconductor laser device according to the first embodiment of the present disclosure.
Figure 9:
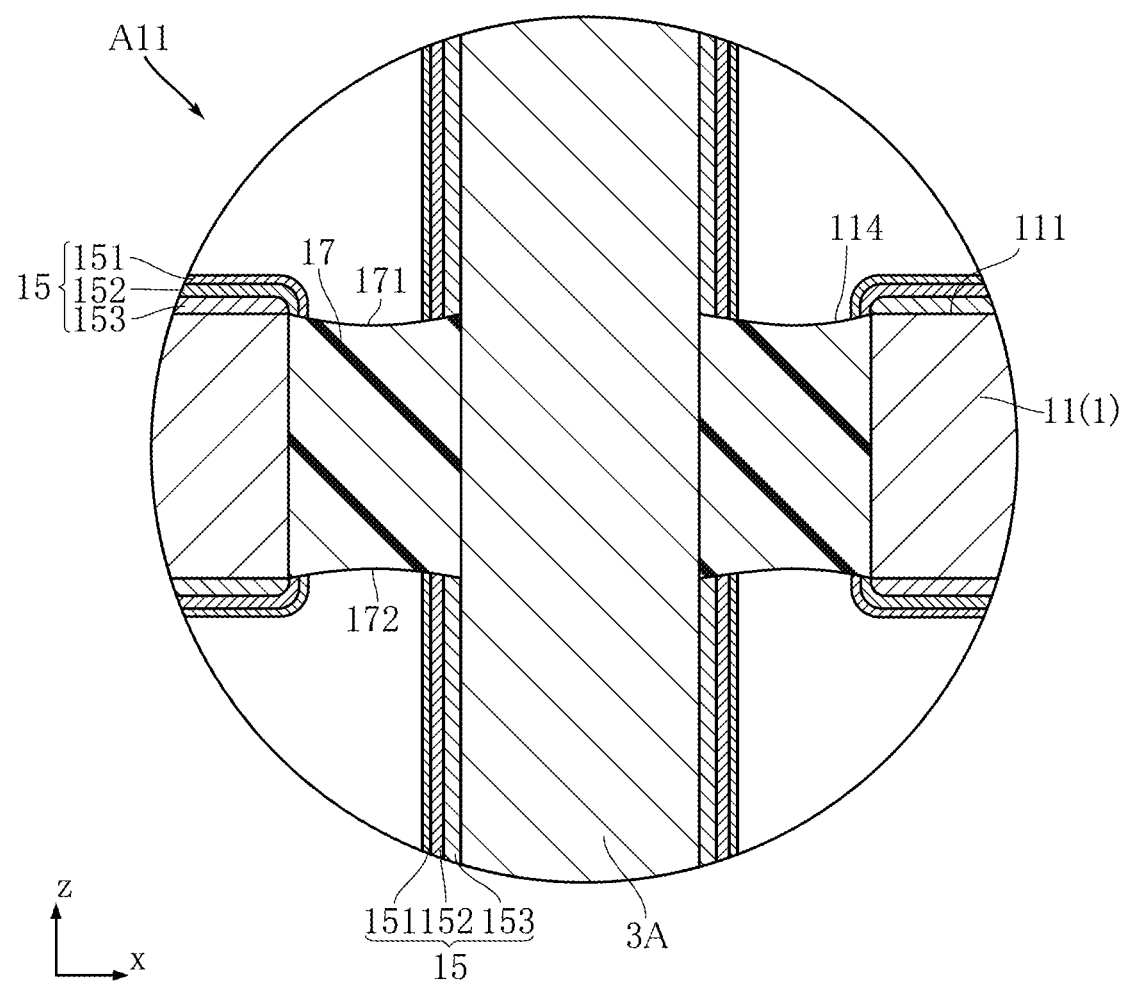
FIG. 9 is an enlarged cross-sectional view showing a main section of the first variation of the semiconductor laser device according to the first embodiment of the present disclosure.

FIGS. 8 and 9 show a first variation of the semiconductor laser device A1. A semiconductor laser device A11 of the present variation is different from the above example in the shapes of the obverse surface 171 and the reverse surface 172 of the insulating filler 17.

In the present variation, the obverse surface 171 is a concave surface that is recessed downward in the z direction in the figures. The reverse surface 172 is a concave surface that is recessed upward in the z direction in the figures. For example, when the glass material of the insulating filler 17 is liquidized during the formation of the insulating filler 17, the obverse surface 171 and the reverse surface 172 are formed into the respective shapes described in the present variation due to the surface tension. The obverse surface 171 and the reverse surface 172 described in the following variations and embodiments may be flat surfaces or the concave surfaces described in the present variation.

Second Variation of First Embodiment

Figure 10:
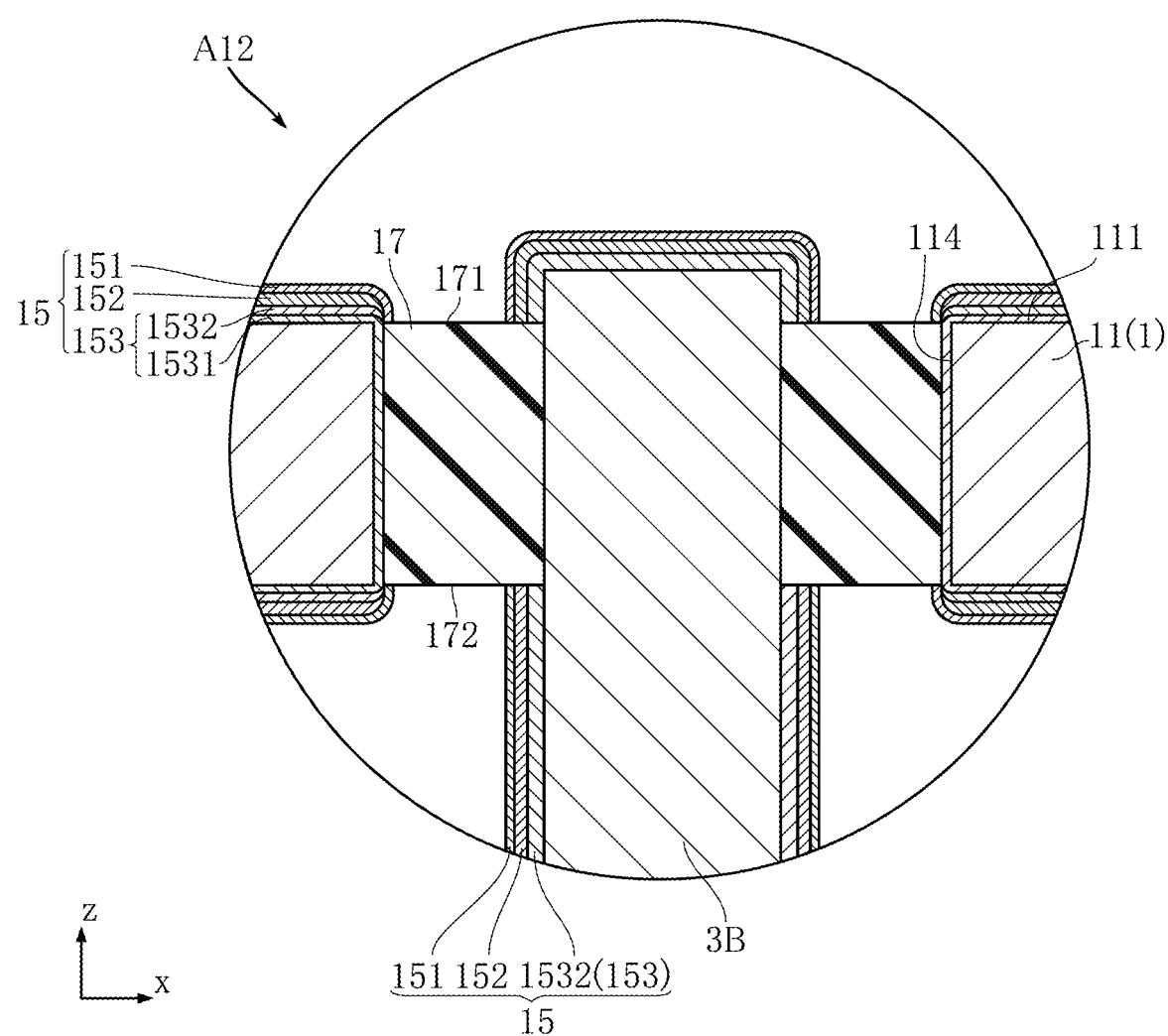
FIG. 10 is an enlarged cross-sectional view showing a main section of a second variation of the semiconductor laser device according to the first embodiment of the present disclosure.
Figure 11:
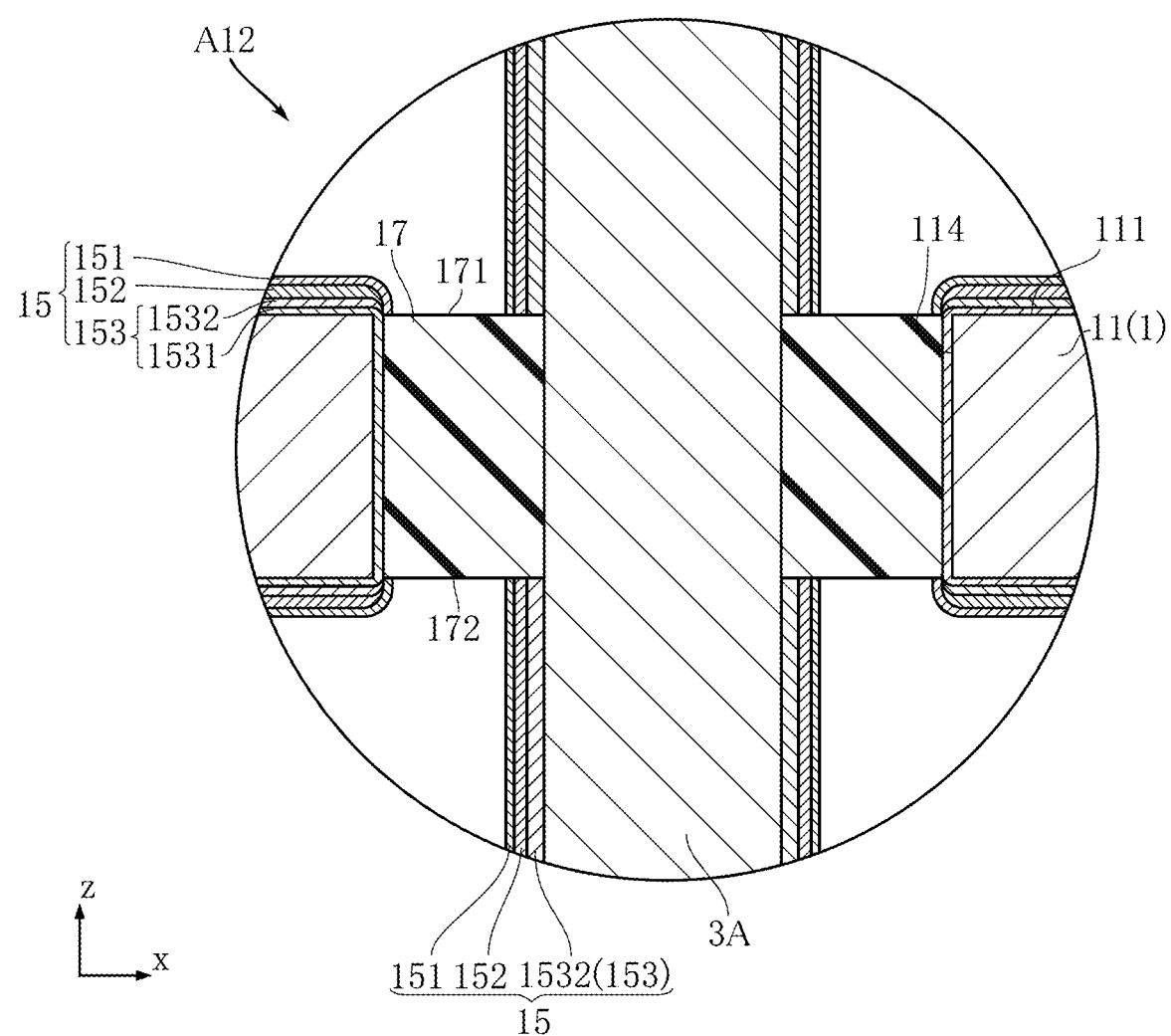
FIG. 11 is an enlarged cross-sectional view showing a main section of the second variation of the semiconductor laser device according to the first embodiment of the present disclosure.
Figure 12:
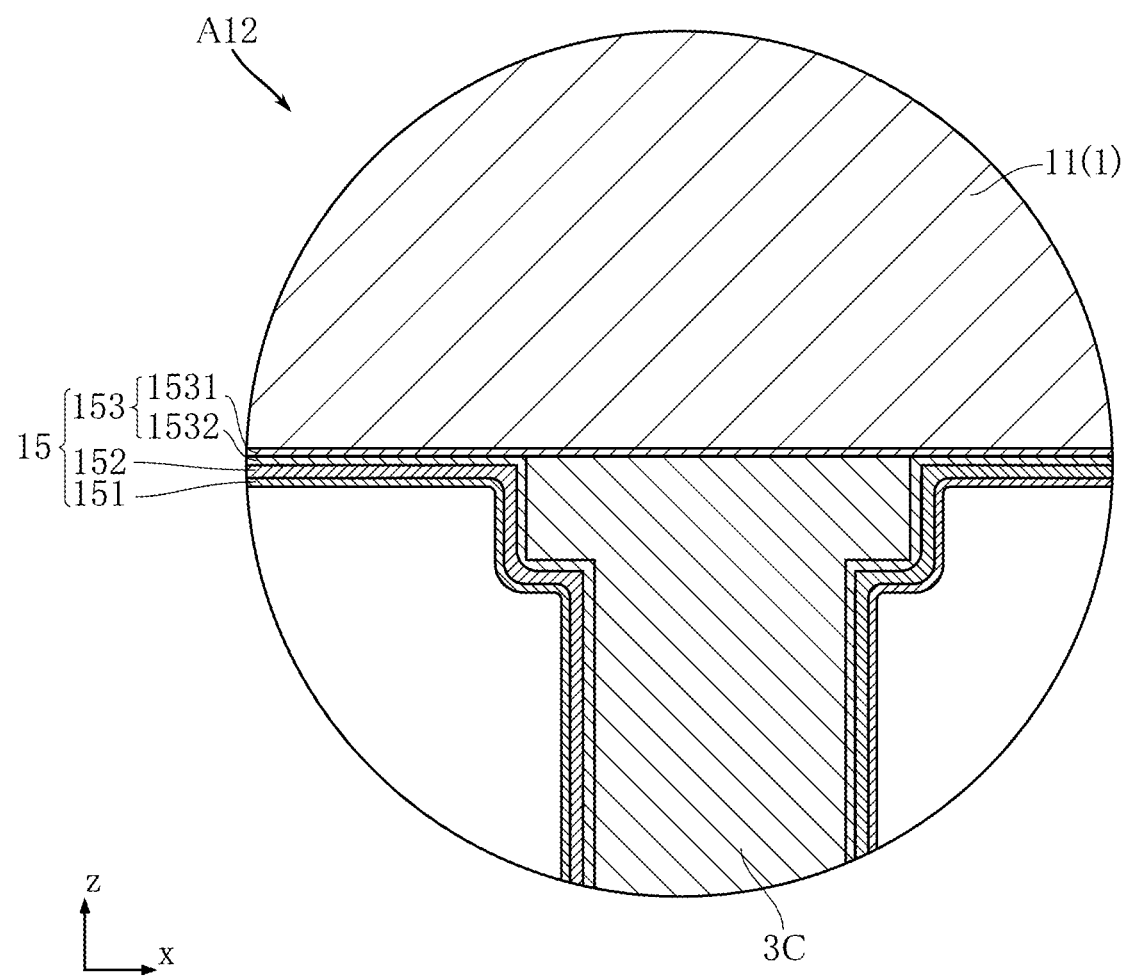
FIG. 12 is an enlarged cross-sectional view showing a main section of the second variation of the semiconductor laser device according to the first embodiment of the present disclosure.

FIGS. 10 to 12 show a second variation of the semiconductor laser device A1. A semiconductor laser device A12 of the present variation is different from the above example in the configuration of the third layer 153.

In the present variation, the third layer 153 includes a primary layer 1531 and a secondary layer 1532. The primary layer 1531 and the secondary layer 1532 are made of the same material as the third layer 153 of the above example. The primary layer 1531 is formed on the outer surface of the base 11 of the stem 1. That is, the obverse surface 111 and the lead through-holes 114 are covered with the primary layer 1531. At the base 11, the secondary layer 1532 is formed on the primary layer 1531. Accordingly, the third layer 153 on the base 11 includes the primary layer 1531 and the secondary layer 1532. In the illustrated example, the primary layer 1531 is not formed on the lead 3A, the lead 3B, or the lead 3C. The secondary layer 1532 is directly formed on the leads 3A, 3B, and 3C. Accordingly, regarding the leads 3A, 3B, and 3C, the third layer 153 is formed of only the secondary layer 1532.

Each of the primary layer 1531 and the secondary layer 1532 may have the same thickness as the third layer 153 in the above example. Alternatively, the total thickness of the primary layer 1531 and the secondary layer 1532 may be the same as the thickness of the third layer 153 described above.

As can be understood in the present variation, the configuration of the third layer 153 is not limited, and can be selected from various configurations. In the following embodiments, the third layer 153 may have a configuration selected from various configurations, such as a single layer configuration or a multi-layer configuration including the primary layer 1531 and the secondary layer 1532.

Second Embodiment

Figure 13:
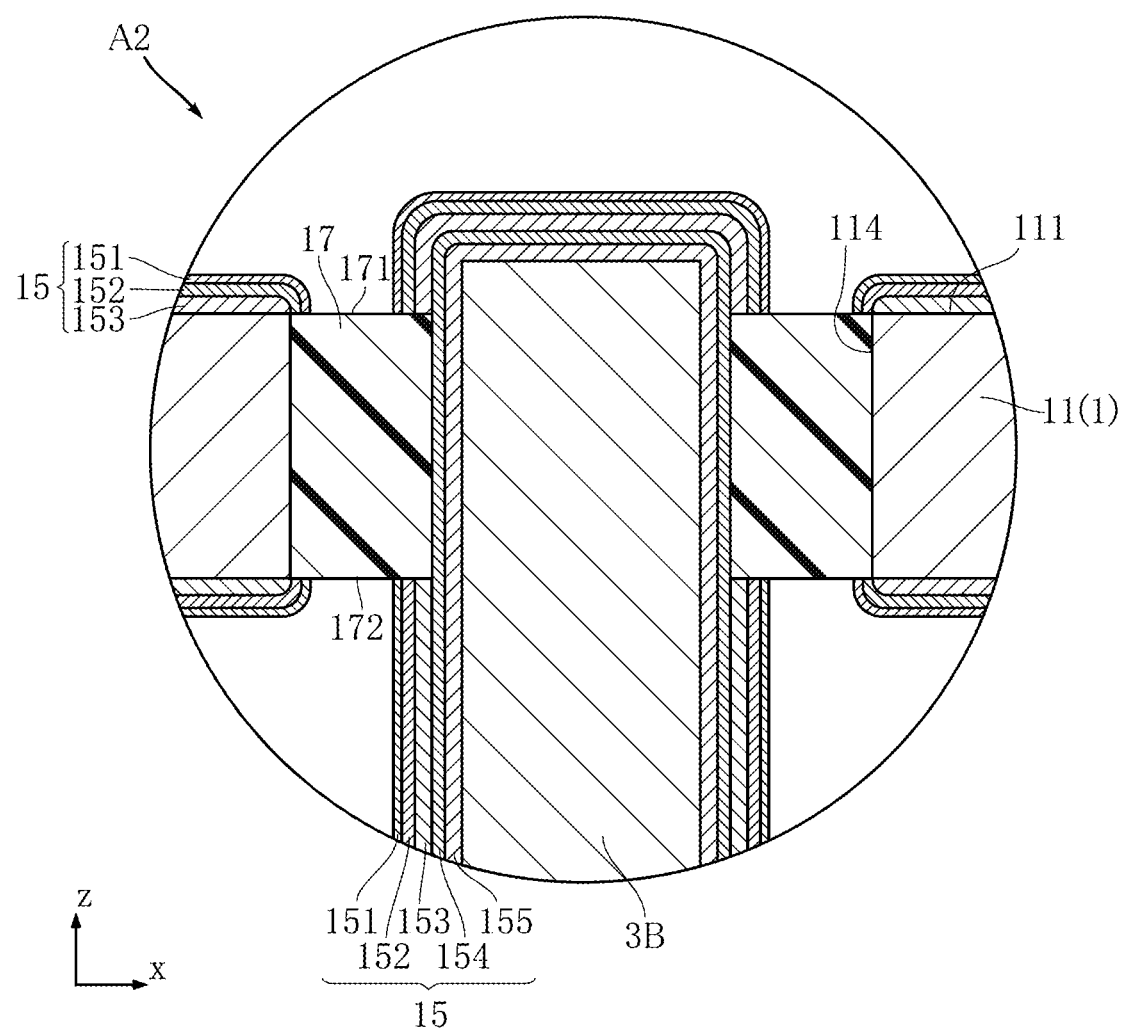
FIG. 13 is an enlarged cross-sectional view showing a main section of a semiconductor laser device according to a second embodiment of the present disclosure.
Figure 14:
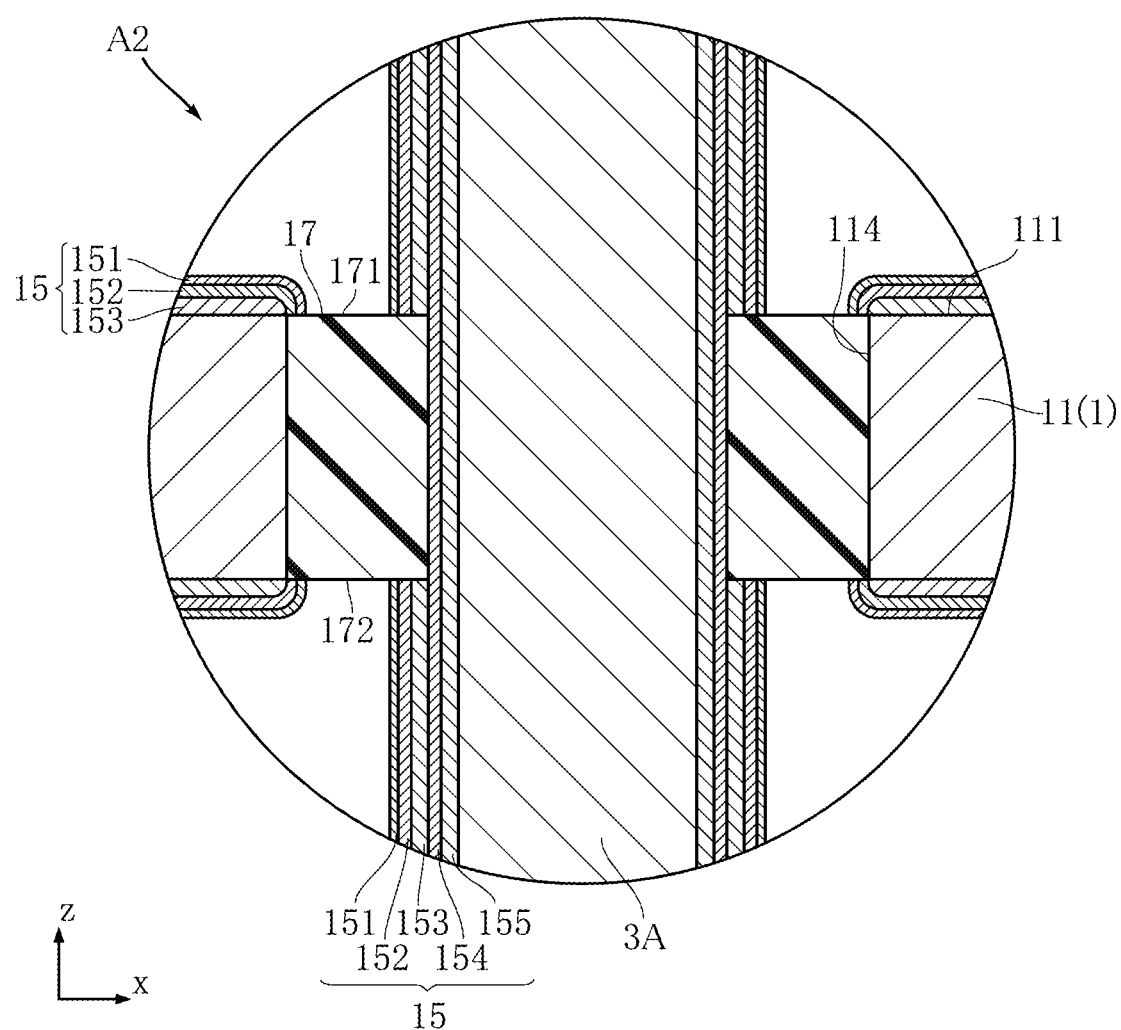
FIG. 14 is an enlarged cross-sectional view showing a main section of the semiconductor laser device according to the second embodiment of the present disclosure.
Figure 15:
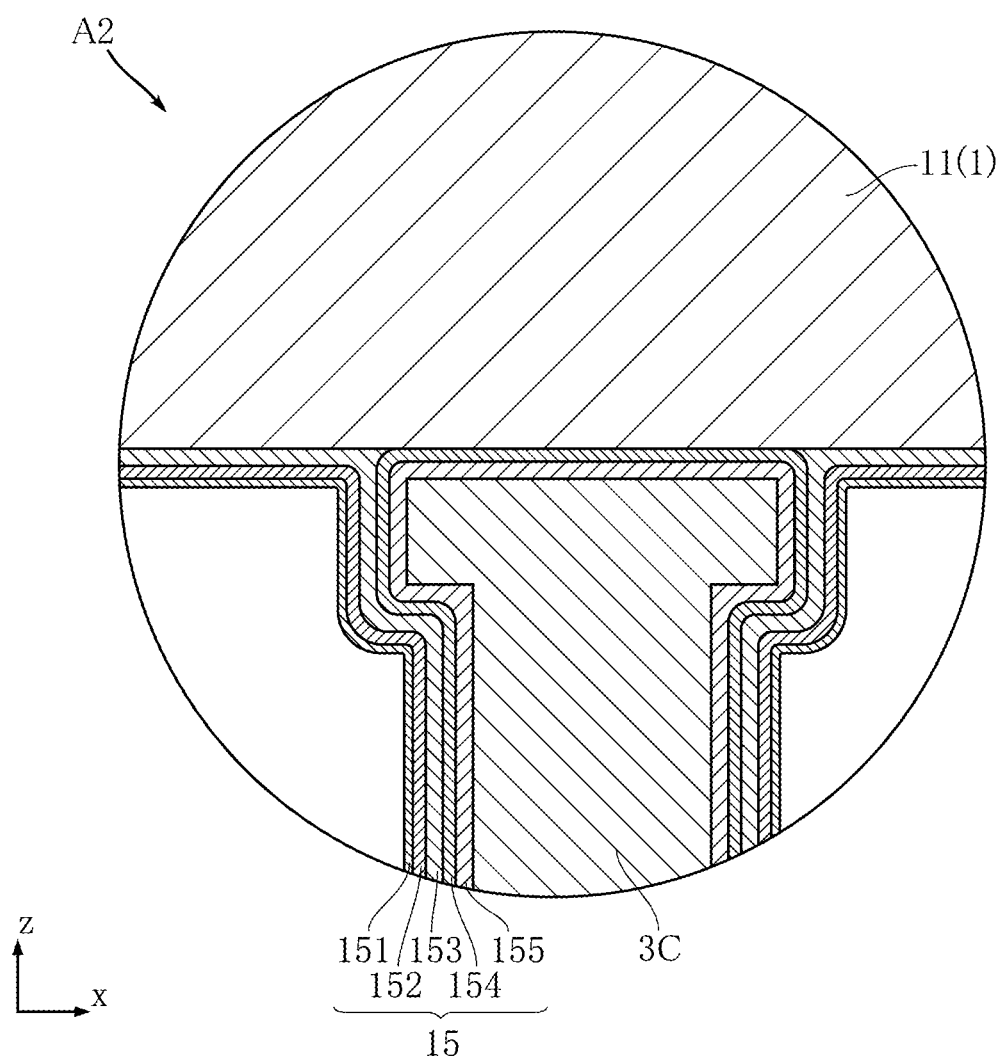
FIG. 15 is an enlarged cross-sectional view showing a main section of the semiconductor laser device according to the second embodiment of the present disclosure.

FIGS. 13 to 15 show a semiconductor laser device according to a second embodiment of the present disclosure. In a semiconductor laser device A2 according to the present embodiment, the first metal layer 15 includes the first layer 151, the second layer 152, the third layer 153, a fourth layer 154, and a fifth layer 155.

The fourth layer 154 is provided between the leads 3A, 3B, 3C and the third layer 153. The fifth layer 155 is provided between the leads 3A, 3B, 3C and the fourth layer 154. In the illustrated example, the fifth layer 155 is in contact with the leads 3A, 3B, and 3C. The fourth layer 154 is in contact with the third layer 153 and the fifth layer 155.

The crystal grains in the fourth layer 154 are smaller than those in the fifth layer 155. For example, the fourth layer 154 may be a Pd plating layer. For example, the fifth layer 155 may be a Ni plating layer.

Neither the fourth layer 154 nor the fifth layer 155 is formed on the base 11. Accordingly, at the base 11, the third layer 153 is in contact with the base 11.

The first layer 151, the second layer 152, and the third layer 153 are formed in areas excluding the boundary between the base 11 and the insulating filler 17. That is, the first layer 151, the second layer 152, and the third layer 153 are formed to cover the obverse surface 111 of the base 11, the surface opposite to the obverse surface 111, and the peripheral end surface, but are not formed in the lead through-holes 114. The first layer 151, the second layer 152, and the third layer 153 are also formed in areas excluding the boundary between the leads 3A, 3B and the insulating filler 17. That is, the first layer 151, the second layer 152, and the third layer 153 are formed to cover the portions of the leads 3A and 3B that are exposed from the insulating filler 17.

As shown in FIGS. 13 and 14, the fourth layer 154 and the fifth layer 155 are provided between the leads 3A, 3B and the insulating filler 17. That is, in the present embodiment, the fourth layer 154 and the fifth layer 155 cover the entirety of each of the leads 3A and 3B.

As shown in FIG. 15, the fourth layer 154 and the fifth layer 155 are provided between the lead 3C and the base 11. That is, the fourth layer 154 and the fifth layer 155 cover the entirety of the lead 3C. The first layer 151, the second layer 152, and the third layer 153 are formed in areas excluding the boundary between the lead 3C and the base 11.

In the manufacturing of the semiconductor laser device A2 according to the present embodiment, the fifth layer 155 and the fourth layer 154 are formed first on the leads 3A, 3B, and 3C in this order by barrel plating. Next, the leads 3A, 3B, and 3C are attached to the base 11. Then, the third layer 153, the second layer 152, and the first layer 151 are formed in this order by barrel plating on the base 11, and the leads 3A, 3B, and 3C.

Such an embodiment can also suppress corrosion of the semiconductor laser device A2. According to the present embodiment, the leads 3A, 3B, and 3C are covered with the fourth layer 154 and the fifth layer 155, in addition to the first layer 151, the second layer 152, and the third layer 153. The inventors have found that the leads 3A, 3B, and 3C are more susceptible to corrosion than the base 11. The semiconductor laser device A2 can further suppress corrosion of the leads 3A, 3B, and 3C and further extend its usable life.

Third Embodiment

Figure 16:
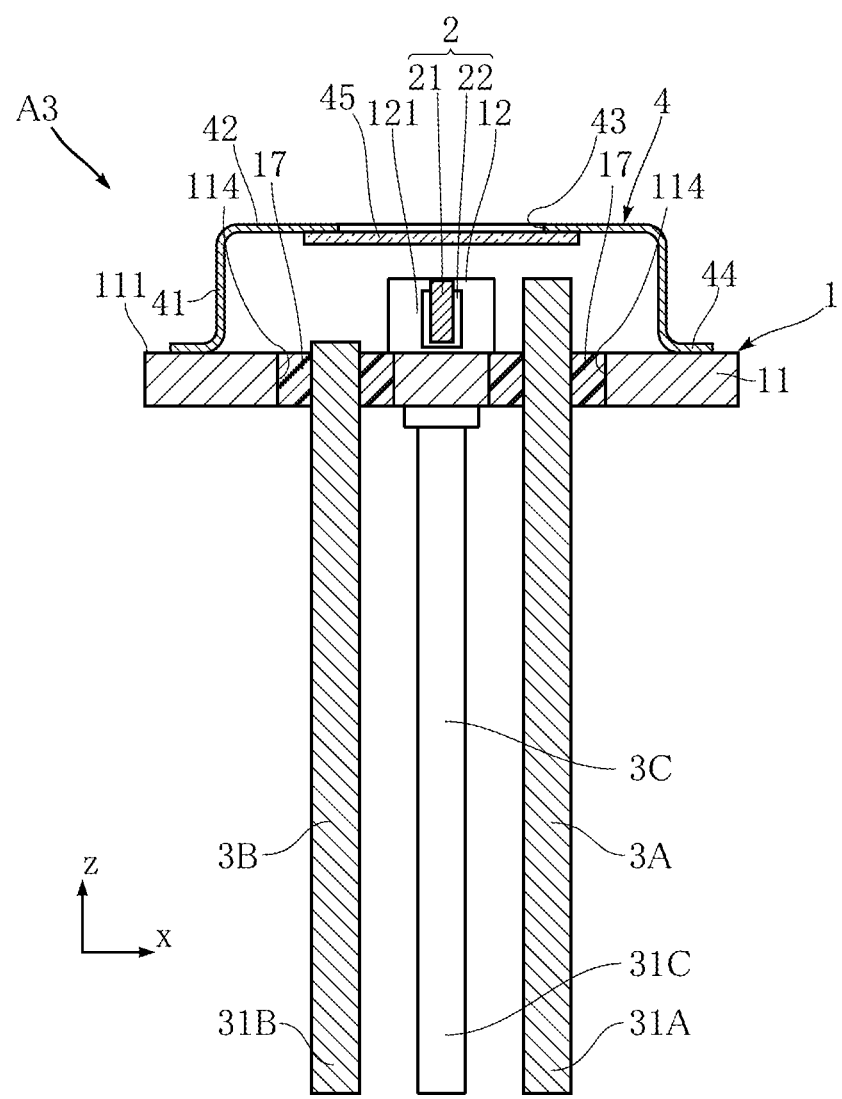
FIG. 16 is a cross-sectional view showing a semiconductor laser device according to a third embodiment of the present disclosure.
Figure 17:
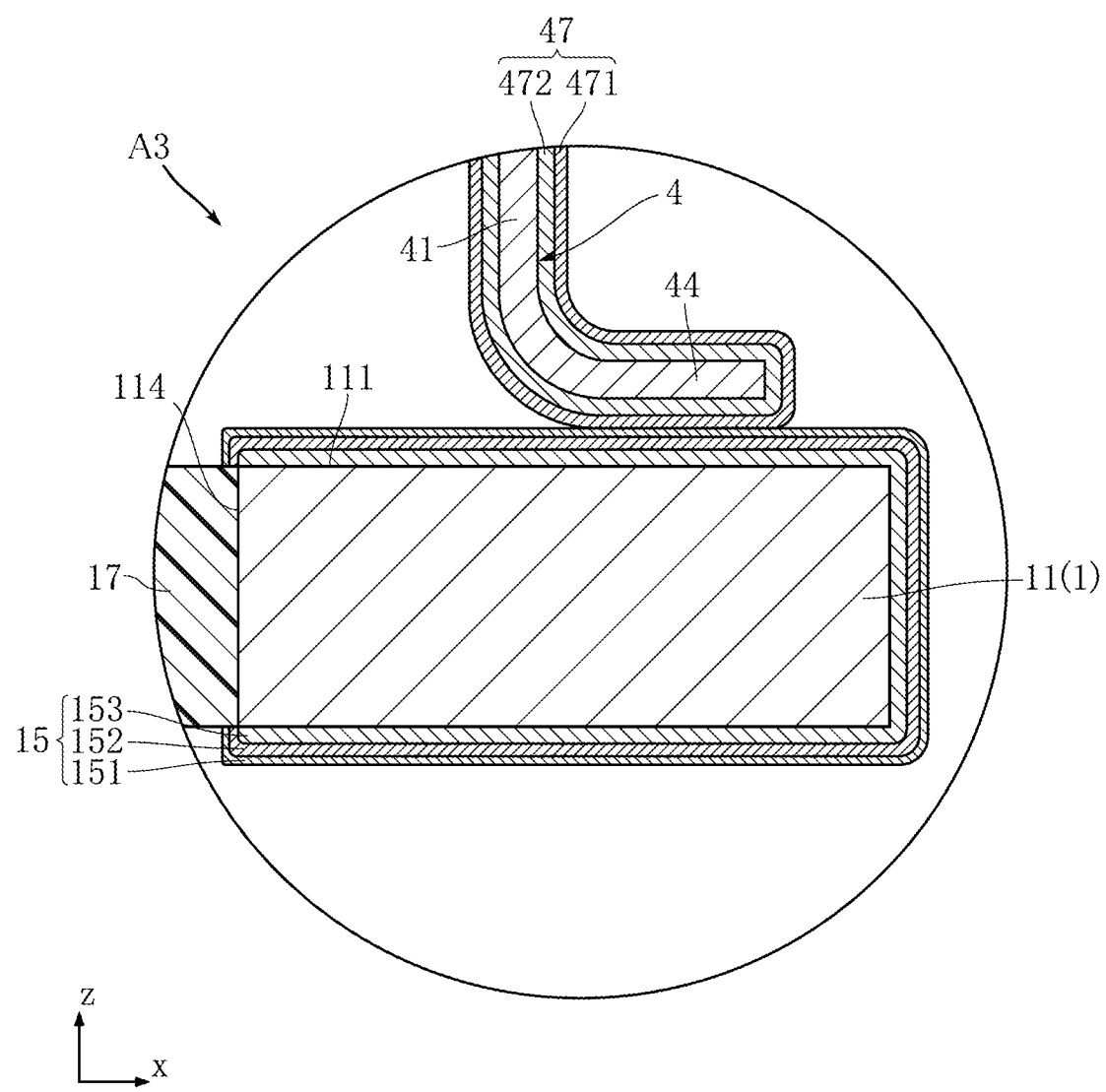
FIG. 17 is an enlarged cross-sectional view showing a main section of the semiconductor laser device according to the third embodiment of the present disclosure.

FIGS. 16 to 17 show a semiconductor laser device according to a third embodiment of the present disclosure. A semiconductor laser device A3 includes the stem 1, the semiconductor laser chip 2, a cap 4, the wire 5, a first metal layer 15, and a second metal layer 47.

The cap 4 covers the semiconductor laser chip 2 and the block 12, and is fixed to the obverse surface 111 of the base 11 of the stem 1. The cap 4 has a body portion 41, a top portion 42, a flange portion 44, and a transparent cover 45. The body portion 41 surrounds the semiconductor laser chip 2 and the block 12 as viewed in the z direction, and has a circular shape, for example. The cap 4 may be made of, but not limited to, Fe or an Fe alloy.

The top portion 42 is connected to the forward end of the body portion 41 in the z direction, and is located more forward than the semiconductor laser chip 2 in the z direction. In the present embodiment, the top portion 42 has a circular shape. The top portion 42 is formed with an opening 43. The opening 43 allows light from the semiconductor laser chip 2 to pass through. In the present embodiment, the opening 43 has a circular shape.

The flange portion 44 is connected to the backward end of the body portion 41 in the z direction, and extends outward along the xy plane. The flange portion 44 has an annular shape, for example, and is fixed to the obverse surface 111 of the base 11 by welding or a joining material, for example.

The transparent cover 45 closes the opening 43 and transmits light from the semiconductor laser chip 2. The transparent cover 45 is made of a material that is transparent to light from the semiconductor laser chip 2. When the transparent cover 45 as described above is provided, light from the semiconductor laser device A3 can be selectively emitted to a relatively narrow area. In the present embodiment, the transparent cover 45 is attached to the lower surface of the top portion 42 of the cap 4 in the figure.

The second metal layer 47 covers the body portion 41, the top portion 42, and the flange portion 44 of the cap 4. The second metal layer 47 includes a sixth layer 471 and a seventh layer 472. The sixth layer 471 covers the body portion 41, the top portion 42, and the flange portion 44 of the cap 4. The seventh layer 472 is interposed between the sixth layer 471 and each of the body portion 41, the top portion 42, and the flange portion 44 of the cap 4.

The crystal grains in the sixth layer 471 are smaller than those in the seventh layer 472. The sixth layer 471 is made of the same material as the second layer 152. For example, the sixth layer 471 may be a Pd plating layer. The seventh layer 472 is made of the same material as the third layer 153. For example, the seventh layer 472 may be a Ni plating layer.

The sixth layer 471 is thinner than the seventh layer 472. The sixth layer 471 has a thickness of approximately 0.05 µm to 1.0 µm, for example. The seventh layer 472 has a thickness of approximately 2.0 µm to 5.0 µm, for example.

The first metal layer 15 of the present embodiment may have the same configuration as the first metal layer 15 of the semiconductor laser device A1 or the first metal layer 15 of the semiconductor laser device A2, depending on the situation.

Such an embodiment can also suppress corrosion of the semiconductor laser device A3. According to the present embodiment, the cap 4 can protect the semiconductor laser chip 2, whereby the usable life of the semiconductor laser device A3 can be further extended.

Furthermore, the cap 4 is covered with the second metal layer 47. Since the sixth layer 471 suppresses diffusion of the seventh layer 472, for example, it is possible to suppress corrosion of the cap 4.

Fourth Embodiment

Figure 18:
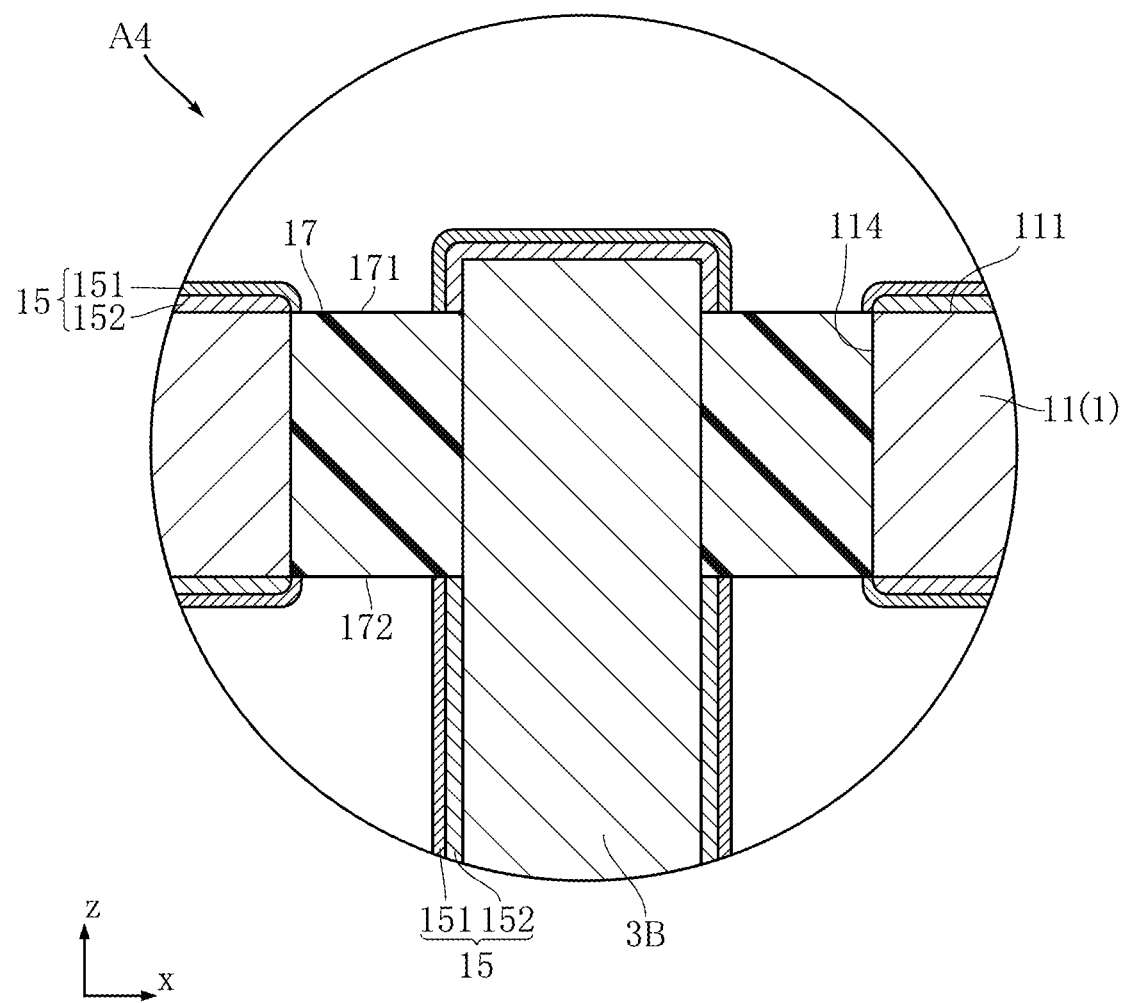
FIG. 18 is an enlarged cross-sectional view showing a semiconductor laser device according to a fourth embodiment of the present disclosure.

FIG. 18 shows a semiconductor laser device according to a fourth embodiment of the present disclosure. A semiconductor laser device A4 of the present embodiment is different from those in the above embodiments in the configuration of the first metal layer 15. In the present embodiment, the first metal layer 15 is made up of the first layer 151 and the second layer 152. The second layer 152 is provided between the first layer 151 and each of the base 11 and the leads 3A, 3B, and 3C. The first layer 151 is made of Au, for example. The second layer 152 is made of Ni, for example. The first layer 151 has a thickness of no less than 1.0 µm, preferably 3.5 µm to 5.0 µm. The second layer 152 has a thickness of 2.0 µm to 4.0 µm, for example.

Such an embodiment can also suppress corrosion of the semiconductor laser device A4.

The semiconductor device according to the present disclosure is not limited to those in the above embodiments. Various design changes can be made to the specific configurations of the elements of the semiconductor device according to the present disclosure.

Clause 1.
  A semiconductor laser device comprising:
  a semiconductor laser chip;
  a stem including a base and a lead fixed to the base, the stem supporting the semiconductor laser chip; and
  a first metal layer including a first layer covering the base and the lead, a second layer interposed between the first layer and each of the base and the lead, and a third layer interposed between the second layer and each of the base and the lead,
  wherein crystal grains in the second layer are smaller than crystal grains in the third layer.

Clause 2.
  The semiconductor laser device according to clause 1, wherein the second layer is thicker than the first layer.

Clause 3.
  The semiconductor laser device according to clause 2, wherein the second layer is thinner than the third layer.

Clause 4.
  The semiconductor laser device according to clause 2 or 3, wherein the first layer is made of Au.

Clause 5.
  The semiconductor laser device according to clause 4, wherein the second layer is made of Pd.

Clause 6.
  The semiconductor laser device according to clause 5, wherein the third layer is made of Ni.

Clause 7.
  The semiconductor laser device according to clause 6, wherein the first layer has a thickness of 0.01 µm to 0.1 µm.

Clause 8.
  The semiconductor laser device according to clause 7, wherein the second layer has a thickness of 0.05 µm to 1.0 µm.

Clause 9.
  The semiconductor laser device according to clause 8, wherein the third layer has a thickness of approximately 2.0 µm to 5.0 µm.

Clause 10.
The semiconductor laser device according to any of clauses 1 to 9, wherein the stem includes a block fixed to the base and supporting the semiconductor laser chip.

Clause 11.
The semiconductor laser device according to clause 10, wherein the base is formed with a through-hole for insertion of the lead.

Clause 12.
The semiconductor laser device according to clause 11, further comprising an insulator interposed between the base and the lead.

Clause 13.
The semiconductor laser device according to clause 12, wherein the first metal layer is formed in an area excluding a boundary between the base and the insulator.

Clause 14.
The semiconductor laser device according to clause 13, wherein the first metal layer is formed in an area excluding a boundary between the lead and the insulator.

Clause 15.
The semiconductor laser device according to clause 12, wherein the first metal layer includes a fourth layer interposed between the lead and the third layer, and a fifth layer interposed between the lead and the fourth layer, and
crystal grains in the fourth layer are smaller than crystal grains in the fifth layer.

Clause 16.
The semiconductor laser device according to clause 15, wherein the fourth layer is made of Pd, and
the fifth layer is made of Ni.

Clause 17.
The semiconductor laser device according to claim 15 or 16, wherein the third layer and the base are in contact with each other.

Clause 18.
The semiconductor laser device according to clause 17, wherein the first layer, the second layer, and the third layer are formed in an area excluding a boundary between the base and the insulator.

Clause 19.
The semiconductor laser device according to clause 18, wherein the first layer, the second layer, and the third layer are formed in an area excluding a boundary between the lead and the insulator.

Clause 20.
The semiconductor laser device according to clause 19, wherein the fourth layer and the fifth layer are interposed between the lead and the insulator.

Clause 21.
The semiconductor laser device according to clauses 12 to 20, comprising:
a cap fixed to the base and covering the semiconductor laser chip, the cap having an opening that allows passage of light from the semiconductor laser chip; and
a second metal layer including a sixth layer covering the cap, and a seventh layer interposed between the cap and the sixth layer,
wherein crystal grains in the sixth layer are smaller than crystal grains in the seventh layer.

Clause 22.
The semiconductor laser device according to clause 21, wherein the sixth layer and the second layer are made of a same material, and
the seventh layer and the third layer are made of a same material.

Clause 23.
A semiconductor laser device comprising:
a semiconductor laser chip;
a stem including a base and a lead fixed to the base, the stem supporting the semiconductor laser chip; and
a first metal layer including a first layer covering the base and the lead, and a second layer interposed between the first layer and each of the base and the lead,
wherein the first layer is made of Au, and the second layer is made of Ni, and
the first layer has a thickness of no less than 1.0 µm.

The invention claimed is:

1. A semiconductor laser device comprising:
a semiconductor laser chip;
a stem including a base and a lead fixed to the base, the stem supporting the semiconductor laser chip; and
a first metal layer including a first layer covering the base and the lead, a second layer interposed between the first layer and each of the base and the lead, and a third layer interposed between the second layer and each of the base and the lead,
wherein crystal grains in the second layer are smaller than crystal grains in the third layer,
the stem includes a block fixed to the base and supporting the semiconductor laser chip,
the base is formed with a through-hole for insertion of the lead,
the semiconductor laser device further comprises an insulator interposed between the base and the lead, and
the first metal layer is formed in an area excluding a boundary between the base and the insulator.

2. The semiconductor laser device according to claim 1, wherein the second layer is thicker than the first layer.

3. The semiconductor laser device according to claim 2, wherein the second layer is thinner than the third layer.

4. The semiconductor laser device according to claim 2, wherein the first layer is made of Au.

5. The semiconductor laser device according to claim 4, wherein the second layer is made of Pd.

6. The semiconductor laser device according to claim 5, wherein the third layer is made of Ni.

7. The semiconductor laser device according to claim 6, wherein the first layer has a thickness of 0.01 µm to 0.1 µm.

8. The semiconductor laser device according to claim 7, wherein the second layer has a thickness of 0.05 µm to 1.0 µm.

9. The semiconductor laser device according to claim 8, wherein the third layer has a thickness of approximately 2.0 µm to 5.0 µm.

10. The semiconductor laser device according to claim 1, wherein the first metal layer is formed in an area excluding a boundary between the lead and the insulator.

11. The semiconductor laser device according to claim 1, wherein the first metal layer includes a fourth layer interposed between the lead and the third layer, and a fifth layer interposed between the lead and the fourth layer, and
crystal grains in the fourth layer are smaller than crystal grains in the fifth layer.

12. The semiconductor laser device according to claim 11, wherein the fourth layer is made of Pd, and
the fifth layer is made of Ni.

13. The semiconductor laser device according to claim 11, wherein the third layer and the base are in contact with each other.

14. The semiconductor laser device according to claim 13, wherein the first layer, the second layer, and the third layer are formed in an area excluding a boundary between the base and the insulator.

15. The semiconductor laser device according to claim 14, wherein the first layer, the second layer, and the third layer are formed in an area excluding a boundary between the lead and the insulator.

16. The semiconductor laser device according to claim 15, wherein the fourth layer and the fifth layer are interposed between the lead and the insulator.

17. The semiconductor laser device according to claim 1, further comprising:
   a cap fixed to the base and covering the semiconductor laser chip, the cap including an opening that allows passage of light from the semiconductor laser chip; and
   a second metal layer including a sixth layer covering the cap, and a seventh layer interposed between the cap and the sixth layer,
   wherein crystal grains in the sixth layer are smaller than crystal grains in the seventh layer.

18. The semiconductor laser device according to claim 17, wherein the sixth layer and the second layer are made of a same material, and
   the seventh layer and the third layer are made of a same material.

* * * * *